US008133788B2

(12) United States Patent
Sayama et al.

(10) Patent No.: US 8,133,788 B2
(45) Date of Patent: Mar. 13, 2012

(54) METHOD OF MANUFACTURING SEMICONDUCTOR DEVICE

(75) Inventors: Yasuyuki Sayama, Ota (JP); Tetsuya Okada, Kumagaya (JP); Makoto Oikawa, Ota (JP); Hiroyasu Ishida, Ora-gun (JP); Kazunari Kushiyama, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 242 days.

(21) Appl. No.: 12/567,050

(22) Filed: Sep. 25, 2009

(65) Prior Publication Data

US 2010/0015772 A1    Jan. 21, 2010

Related U.S. Application Data

(62) Division of application No. 11/373,488, filed on Mar. 13, 2006, now abandoned.

(30) Foreign Application Priority Data

Mar. 17, 2005   (JP) .................................. 2005-077570
Feb. 24, 2006   (JP) .................................. 2006-048729

(51) Int. Cl.
*H01L 21/336* (2006.01)
(52) U.S. Cl. ........ 438/283; 438/286; 438/301; 257/197; 257/341; 257/342
(58) Field of Classification Search .................. 438/283, 438/286, 301, 186; 257/197, 341–342, E29.013, 257/E21.109
See application file for complete search history.

(56) References Cited

U.S. PATENT DOCUMENTS

| 5,229,634 | A | 7/1993 | Yoshioka et al. |
| 5,814,859 | A | 9/1998 | Ghezzo et al. |
| 6,049,104 | A | 4/2000 | Hshieh et al. |
| 6,649,975 | B2 | 11/2003 | Baliga |
| 2003/0227052 | A1* | 12/2003 | Ono et al. ...................... 257/341 |
| 2006/0011973 | A1 | 1/2006 | Mizukami et al. |
| 2006/0220122 | A1 | 10/2006 | Sayama et al. |
| 2006/0249785 | A1 | 11/2006 | Bhalla et al. |

(Continued)

FOREIGN PATENT DOCUMENTS

DE    19902749 A1    8/2000

(Continued)

OTHER PUBLICATIONS

Chen, Yong-zhen. (2002). "New Type of High Voltage MOSFET," *Power Supply Technologies and Applications* 5(1 2): 43-45; translation of abstract.

(Continued)

*Primary Examiner* — Theresa T Doan
(74) *Attorney, Agent, or Firm* — Morrison & Foerster LLP

(57) ABSTRACT

An n type impurity region is provided below a gate electrode. By setting a gate length to be less than a depth of a channel region, a side surface of the channel region and a side surface of the n type impurity region adjacent to the channel region form a substantially perpendicular junction surface. Thus, since a depletion layer widens uniformly in a depth direction of a substrate, it is possible to secure a predetermined breakdown voltage. Furthermore, since an interval between the channel regions, above which the gate electrode is disposed, is uniform from its surface to its bottom, it is possible to increase an impurity concentration of the n type impurity region, resulting in an achievement of a low on-resistance.

8 Claims, 8 Drawing Sheets

U.S. PATENT DOCUMENTS

| | | | |
|---|---|---|---|
| 2007/0072352 | A1 | 3/2007 | Kushiyama et al. |
| 2009/0085111 | A1 | 4/2009 | Sayama |

FOREIGN PATENT DOCUMENTS

| | | |
|---|---|---|
| JP | 05-121747 | 5/1993 |
| JP | 9-102506 | 4/1997 |
| JP | 2622378 | 4/1997 |
| JP | 2001-119025 | 4/2001 |
| JP | 2007-096033 | 4/2007 |
| JP | 2007-158198 | 6/2007 |
| WO | WO-02/067333 | 8/2002 |

OTHER PUBLICATIONS

Chinese Office Action mailed Mar. 28, 2008, directed at counterpart/related CN application No. 2006100042014; 1 page.

European Search Report mailed on Jun. 3, 2008, directed to counterpart application No. EP-06005521.7-2203; 4 pages.

Kushiyama et al; U.S. Office Action mailed May 1, 2009, directed to U.S. Appl. No. 11/519,208; 11 pages.

Sayama et al.; U.S. Office Action mailed Feb. 22, 2008, directed to U.S. Appl. No. 11/373,488; 10 pages.

Sayama et al.; U.S. Office Action mailed Sep. 10, 2008, directed to U.S. Appl. No. 11/373,488; 10 pages.

Sayama et al.; U.S. Office Action mailed Feb. 4, 2009, directed to U.S. Appl. No. 11/373,488; 12 pages.

Sayama et al.; U.S. Office Action mailed Jun. 25, 2009, directed to U.S. Appl. No. 11/373,488; 12 pages.

Ueda et al, An Ultra-Low On-Resistance Power MOSFET Fabricated by Using a Fully Self-Aligned Process, Apr. 1987, IEEE Transactions on Electron Devices, vol. ED34, No. 4, pp. 926-930.

* cited by examiner

US 8,133,788 B2

METHOD OF MANUFACTURING SEMICONDUCTOR DEVICE

CROSS-REFERENCE OF THE INVENTION

This application claims priority from Japanese Patent Application Nos. 2005-077570 and 2006-048729, the contents of which are incorporated by reference in their entireties. This application is a divisional of Ser. No. 11/373,488, filed Mar. 13, 2006.

BACKGROUND OF THE INVENTION

1. Field of the Invention

The present invention relates to a semiconductor device and a method of manufacturing the same. In particular, the present invention relates to a semiconductor device whose drain-to-source breakdown voltage, $V_{DSS}$, is increased and a method of manufacturing the same.

2. Description of the Related Art

By referring to FIG. 10 and FIGS. 11A to 11C, a conventional semiconductor device and a method of manufacturing the same will be described by taking a MOSFET as an example.

As shown in FIG. 10, a drain region 20 is provided, for example, by laminating an n type epitaxial layer 22 on an n⁺ type silicon semiconductor substrate 21, and a plurality of p type channel regions 24 are provided on a surface of the drain region 20. A gate electrode 33 is provided on a portion on the surface of the n type epitaxial layer between the two p type channel regions 24 which are adjacent to each other, with a gate insulation film 31 interposed therebetween. Peripheries of the gate electrode 33 are covered with an interlayer insulating film 36. Additionally, n⁺ type source regions 35, being formed in the surface of the channel regions 24, are in contact with a source electrode 38.

As a technology for the above-mentioned MOSFET of a so-called planar structure, one in which an n type impurity layer 40 having a higher impurity concentration than the epitaxial layer 22 is arranged on the surface of the n⁻ type epitaxial layer 22 between the two adjacent p type channel regions 24 is also known. In case of a MOSFET whose breakdown voltage is 600 V, it is possible to increase the impurity concentration of the n type impurity layer 40 to approximately $1 \times 10^{16}$ cm⁻³. This technology brings about an effect of reducing a drain-to-source resistance when the MOSFET is in the ON state. This technology is described, for instance, in Japanese Patent Application Publication No. 2622378.

By referring to FIGS. 11A to 11C, the method of manufacturing the above-mentioned MOSFET will be described.

A substrate, obtained, for example, by laminating the n⁻ type epitaxial layer 22 on the n⁺ type silicon semiconductor substrate 21, forms the drain region 20. Ions of an n type impurity (for example, phosphor: P) are implanted into an entire surface of the n⁻ type epitaxial layer (FIG. 11A). Thereafter, the gate oxide film 31 and the gate electrode 33 are formed. Then, ions of a p type impurity (for example, boron: B) are implanted, by using the gate electrode 33 as a mask (FIG. 11B). Subsequently, by diffusing the n type impurity and the p type impurity through a thermal treatment, the n type impurity layer 40 and the channel regions 24 are formed. On the surface of the channel regions 24, the source regions 35 are formed (FIG. 11C). Then, the gate electrode 33 is covered with the interlayer insulating film and the source electrode (not illustrated) is formed.

In the MOSFET shown in FIG. 10, when the MOSFET is in the ON state, the drain region 20 below the gate electrode 33 works as a region for causing an electric current to flow in a direction perpendicular to the substrate. That is, the n type impurity layer 40 having a high impurity concentration is arranged in a portion (hereinafter, referred to as a π portion 45) on the surface of the drain region 20 between each two adjacent ones of the channel regions 24 because it is preferable that, when the MOSFET is in the ON state, a resistance of the drain region 20 be low.

On the other hand, when the MOSFET is in the OFF state, a drain-to-source voltage is applied and a reverse bias is generated. As a result, a depletion layer 50 extends from pn junctions with the channel region 24 and generates a depletion state, whereby the breakdown voltage is increased. That is, it is preferable that the impurity concentration of the π portion 45 be higher in order to allow the drain region 20 to have a lower resistance. However, if the impurity concentration of the π portion 45 increases more than necessarily, the extension width of the depletion layer 50 becomes narrow as shown in the dotted line of FIG. 10, whereby there arises a problem that a breakdown voltage is deteriorated.

Additionally, because a curvature from a bottom to a side surface becomes large in each of the channel regions 24 formed through diffusion, the interval between the two adjacent ones of the channel regions 24 becomes wide in vicinity of the bottoms thereof. That is, the depletion layer 50 pinching off sufficiently in vicinity of the top surface of the channel regions 24 does not sufficiently pinch off in vicinity of the bottoms thereof, whereby there arises a problem that a breakdown tends to occur in corner portions (refer to a region "a" in FIG. 10) of each of the channel regions 24.

Furthermore, because the ion implantation of the n type impurity layer 40 is performed before the formation of the gate electrode (refer to FIG. 11A), the n type impurity (for example, phosphor) is diffused through a thermal treatment during the formation of the gate electrode 33. Therefore, after the formation of the channel regions 24, a depth of each of the channel regions 24 tends to be shallower than that of the π portion 45, whereby a reduced $V_{DSS}$ becomes a problem.

SUMMARY OF THE INVENTION

The present invention provides a semiconductor device that includes a semiconductor substrate of a first general conductivity type, a semiconductor layer of the first general conductivity type disposed on a surface of the semiconductor substrate so as to provide a drain region, two channel regions of a second general conductivity type disposed on the semiconductor layer, an impurity region of the first general conductivity type disposed between the two channel regions, an junction interface between the impurity region and one of the channel regions being perpendicular to the surface of the semiconductor substrate, an insulating film disposed on the impurity region, a gate electrode disposed on the insulating film, and a source region of the first general conductivity type formed in a surface of each of the channel regions.

The present invention also provides a method of manufacturing a semiconductor device. The method includes providing a device intermediate comprising a semiconductor substrate of a first general conductivity type, a semiconductor layer of the first general conductivity type disposed on the semiconductor substrate and a first insulating film disposed on the semiconductor layer, forming a gate electrode on the first insulating film, forming an impurity region of the first general conductivity type in the semiconductor layer under the gate electrode after the formation of the gate electrode, forming two channel regions of a second general conductivity type in the semiconductor layer so that the impurity region connects the two channel regions, forming a source region of the first general conductivity type in each of the channel regions, and forming a second insulating film covering the gate electrode.

The present invention further provides a method of manufacturing a semiconductor device. The method includes providing a device intermediate comprising a semiconductor substrate of a first general conductivity type, a semiconductor layer of the first general conductivity type disposed on a surface of the semiconductor substrate and a first insulating film disposed on the semiconductor layer, forming on the first insulation film a gate electrode having an opening therein, implanting a first impurity for the first general conductivity type into part of the semiconductor layer through the opening of the gate electrode, implanting a second impurity for the second general conductivity type into part of the semiconductor layer that is outside the gate electrode, heating the device intermediate so that the first and second impurities are diffused so as to form an impurity region and a channel region that have an junction interface perpendicular to the surface of the semiconductor substrate, forming a source region of the first general conductivity type in the channel region, and forming a second insulating film covering the gate electrode.

The present invention further provides a semiconductor device that includes a semiconductor substrate of a first general conductivity type, a semiconductor layer of the first general conductivity type disposed on a surface of the semiconductor substrate so as to provide a drain region, two channel regions of a second general conductivity type disposed on the semiconductor layer, an impurity region of the first general conductivity type disposed between the two channel regions so as to connect the two channel regions, an insulating film disposed on the impurity region, a gate electrode disposed on the insulating film and comprising a first gate electrode portion and a second gate electrode portion that are disposed on the impurity region between the two channel regions, the first gate electrode portion being at least partially separated from the second gate electrode portion, and a source region of the first general conductivity type formed in a surface of each of the channel regions.

The present invention further provides a semiconductor device that includes a semiconductor substrate of a first general conductivity type, a semiconductor layer of the first general conductivity type disposed on a surface of the semiconductor substrate so as to provide a drain region, two channel regions of a second general conductivity type disposed on the semiconductor layer, each of the channel regions being elongated in a direction, an impurity region of the first general conductivity type disposed between the two elongated channel regions, the impurity region being elongated in the direction, an insulating film disposed on the elongated impurity region and channel regions, a gate electrode disposed on the insulating film and having a slit elongated in the direction but not reaching an edge portion of the gate electrode, and a source region of the first general conductivity type formed in a surface of each of the channel regions.

DESCRIPTION OF THE PREFERRED EMBODIMENTS

An embodiment of the present invention will be described with reference to FIGS. 1 to 9 by taking an n-channel MOSFET as an example.

Figure 1A:
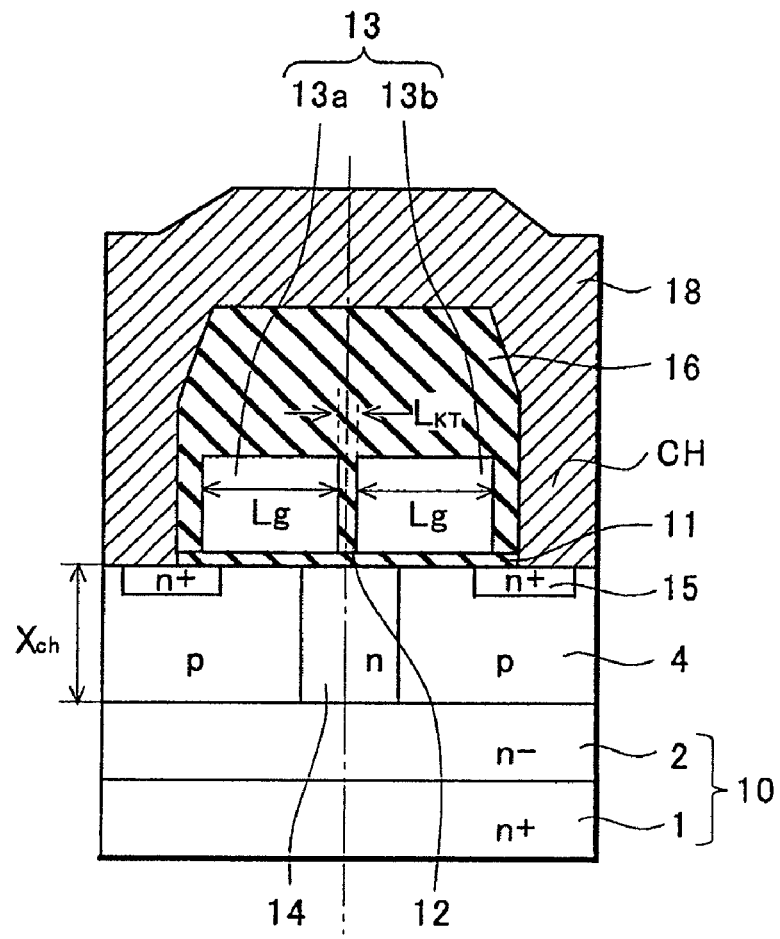
FIGS. 1A and 1B are cross-sectional views and FIG. 1C is a perspective view explaining a semiconductor device of a first and a second embodiments of the invention.
Figure 1B:
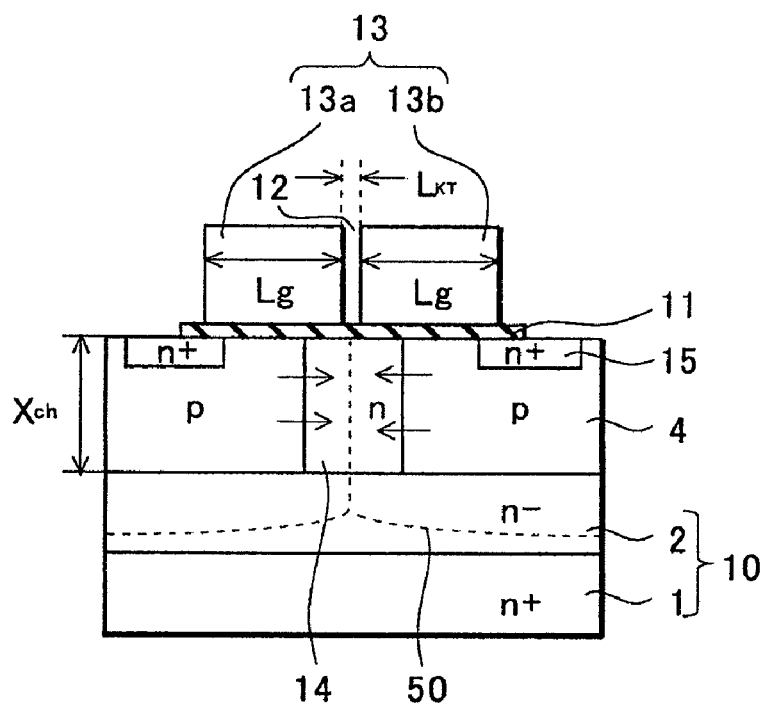
Figure 1C:
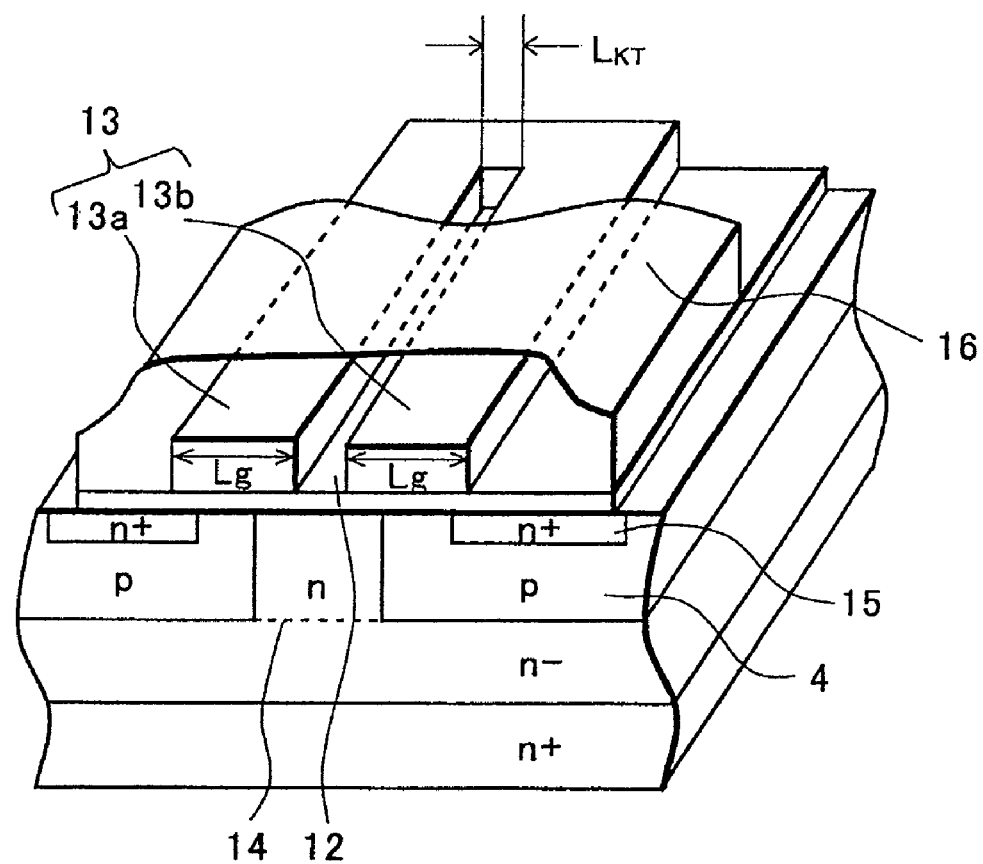

FIGS. 1A and 1B are cross-sectional views indicating a structure of a MOSFET of a first embodiment of the invention. FIGS. 1A and 1B are cross-sectional views showing a single cell of the MOSFET, and plural ones of the cells are arranged to constitute the MOSFET. FIG. 1C shows a perspective view of the MOSFET cut at the section shown in FIG. 1A.

The MOSFET includes a semiconductor substrate 1, a semiconductor layer 2, channel regions 4, a one conductive type impurity region 14, a gate electrode 13, a gate insulation film 11, an interlayer insulating film 16, and source regions 15.

A substrate obtained, for example, by laminating the n$^-$ type epitaxial layer 2 on the n$^+$ type silicon semiconductor substrate 1 is prepared, and thus a drain region 10 is provided. The p type channel regions 4 are provided on the surface of the n-type epitaxial layer 2. The channel regions 4 are a plurality of p type impurity regions provided on the n$^-$ type epitaxial layer 2 through an ion implantation and an ion diffusion. Note that, in some cases, a low-resistance layer 1 is formed on the semiconductor layer 2 by the impurity diffusion.

The gate oxide film 11 is provided on the surface of the n$^-$ type epitaxial layer 2, and the gate electrode 13 is arranged on the gate oxide film 11. The interlayer insulating film 16 is provided over the gate electrode 13. Peripheries of the gate electrode 13 are covered with the gate oxide film 11 and the interlayer insulating film 16.

The cell shown in FIGS. 1A-1C includes the gate electrode 13 that has a separation hole 12 elongated in the longitudinal direction of the gate electrode 13. The width of the separation is $L_{KT}$. In this embodiment, the separation hole 12 does not completely separate the gate electrode 13, and both ends of the gate electrode 13 are left intact. As a modification, one end of the gate electrode 13 may be separated completely while another end holds the separated portions of the gate electrode together. As a further modification, the gate electrode may be completely separated. In either embodiment, all the gate electrode 13 are connected together outside the MOSFET element region on which the cells are formed. As shown in FIG. 1C, the separated gate electrodes 13a and 13b are covered by a single interlayer insulating film 16. Both of the separated gate electrodes 13a and 13b have an equal width $L_g$. As shown in FIG. 1C, the channel region 4 also has an elongated form and is aligned with a corresponding gate electrode.

The source regions 15 are highly concentrated n type impurity region provided in the channel regions 4. Each of the source region 15 is placed in a portion of a region, a part of which is under the gate electrode 13, and the rest being outward thereof. The source regions 15 are in contact with a source electrode 18 through contact holes CH between the interlayer insulating film 16.

In a region under the gate electrode 13 on the surface of the n⁻ type epitaxial layer 2, an n type impurity region 14 is provided. Side surfaces of the n type impurity region 14 and side surfaces of each of the channel region 4 adjacent thereto form a substantially perpendicular junction surfaces. Additionally, a bottom of the n type impurity region 14 and bottoms of the channel regions 4 are located at a substantially equal depth by the diffusion of the impurities.

The separated gate electrodes 13a and 13b are arranged symmetrically with respect to the n type impurity region 14. That is, a centerline of the separation hole 12 substantially coincides with a centerline of the n type impurity region 14 as indicated by an alternate long and short dash line. Additionally, the gate width $L_g$ is not more than a depth $X_{ch}$ of the channel regions 4. In this manner, the n type impurity region 14 having the side surfaces forming the junction surface substantially perpendicular to the channel regions 4, and having the equal depth to that of the channel regions 4 is formed. Details thereof will be described later. Additionally, a drain electrode is formed on a back surface of the substrate 1 although an illustration thereof is omitted. Note that, since the separated gate electrodes 13a and 13b are identical, the following description will be given by using the gate electrode 13 a.

FIG. 1B is a cross-sectional view indicating a state of a depletion layer 50 when drain-to-source voltage is applied in the OFF state. Note that the interlayer insulating film 16 and the source electrode 18 are omitted in FIG. 1B.

In this embodiment, the side surfaces of the n type impurity region 14 respectively form the junction surfaces substantially parallel to the side surfaces of the channel regions 4 adjacent thereto, and the bottom of the n type impurity region 14 and the bottoms of the channel regions 4 are located substantially at an equal depth. That is, the channel regions 4 adjacent to each other are apart from each other not in a manner that cross-sectional shapes of edge portions of the respective channel regions 4 are in curved shapes with the edge portions having curvatures, rather in a manner that an equal distance between the channel regions 4 is kept in vicinity of the top and in vicinity of the bottom. Additionally, the n type impurity region 14 is provided with conditions allowing the depletion layer 50, which extends from the channel regions 4 in both sides thereof, to pinch off. Specifically, a ratio of the separation width $L_{KT}$ of the gate electrode 13 to the depth $X_{ch}$ of the channel regions 4 is set to 0.15 or less: 1.

In this manner, the depletion layer 50 inside the n type impurity region 14 extends from the channel regions 4 in both sides thereof and pinches off as indicated by dashed lines, and thereby extends substantially evenly in a depth direction (vertical direction) of the substrate.

Figure 10:
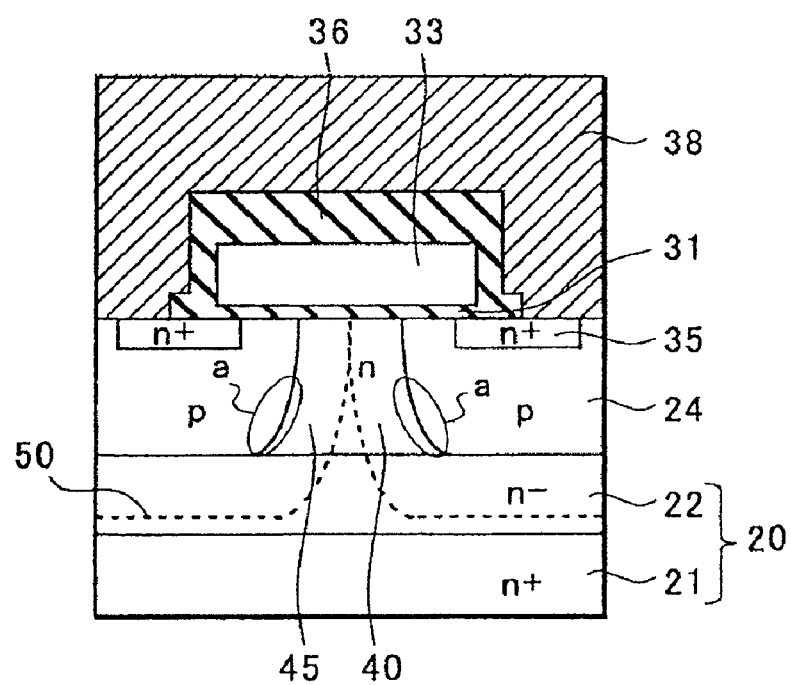
FIG. 10 is a cross-sectional view explaining a conventional semiconductor device.
Figure 11A:
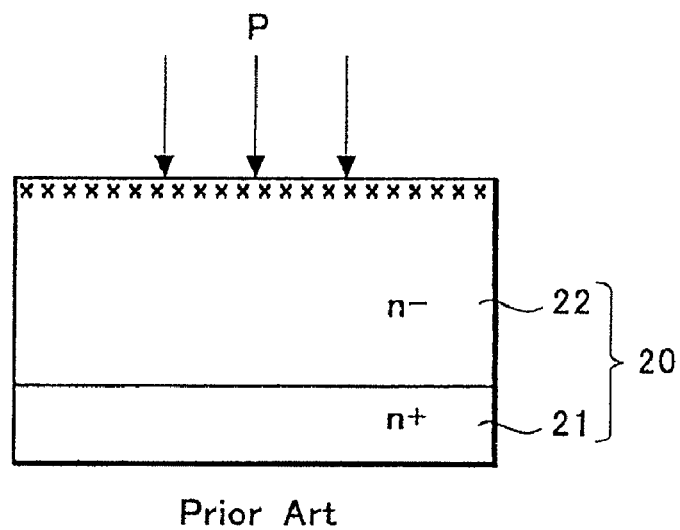
FIGS. 11A to 11C are cross-sectional views explaining a method of manufacturing the conventional semiconductor device.
Figure 11B:
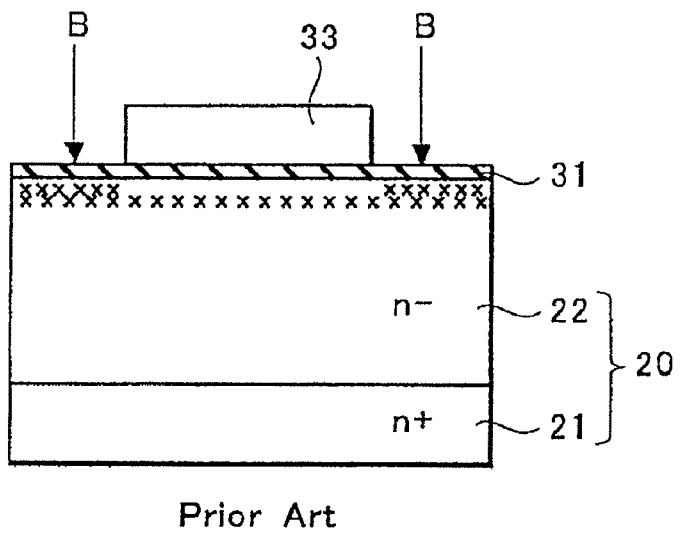
Figure 11C:
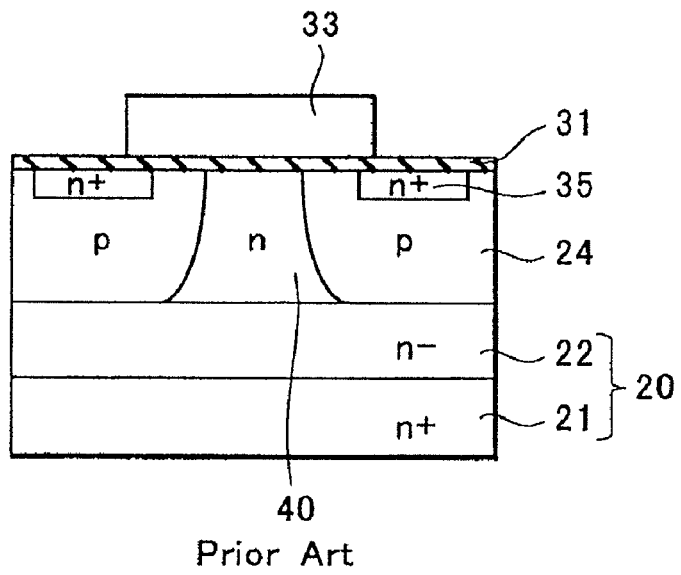

Conventionally, the depletion layer does not sufficiently pinch off in the corner portion (the region "a" in FIG. 10) of each of the channel regions 24, whereby there arises a problem that a breakdown tends to occur in the corner portion. However, in this embodiment, it is possible to avoid this and to enhance a breakdown voltage of the MOSFET.

Additionally, distances between the channel regions 4 arranged with the gate electrode 13 interposed therebetween are uniform at the top surfaces thereof and at the bottoms thereof, whereby the depletion layer 50 sufficiently pinches off. Accordingly, it becomes possible to increase an impurity concentration of the n type impurity region 14. That is, on-resistance reduction is achieved in the ON state of the MOSFET.

As described above, in this embodiment, the bottoms of the channel regions 4 and the bottom of the n type impurity region 14 are formed in a substantially same plane. Then, when the drain-to-source voltage is applied in the OFF state of the MOSFET, the depletion layer 50 extending from the channel regions 4 in the both sides thereof is allowed to pinch off in the n type impurity region 14.

In the manner described above, it is possible to obtain a semiconductor device ensuring a predetermined breakdown voltage and having a low on-resistance in the ON state of the MOSFET.

Next, a second embodiment of the invention will be described.

As shown in FIGS. 1A and 1B (the first embodiment), respective junction surfaces of side surfaces of an n type impurity region 14 and channel regions 4 can be formed to be substantially perpendicular by setting the gate width $L_g$ to be not more than the depth $X_{ch}$ of the channel regions 4. Additionally, by allowing a depletion layer 50 to pinch off evenly inside the n type impurity region 14 in the depth (vertical) direction of the substrate, a predetermined breakdown voltage can be obtained.

In the second embodiment, more specifically, an MOSFET capable of obtaining a predetermined breakdown voltage will be described. Note that, because a structure thereof is the same as the one shown in FIGS. 1A and 1B, the description will be given by referring to FIGS. 1A and 1B.

In the second embodiment, a description will be given by taking as an example a MOSFET to which a drain-to-source voltage not less than 600 V can be applied, i.e., a MOFSET realizing a breakdown voltage of 600 V or higher.

As in the case with the first embodiment, in order to make a side surface of a n type impurity region 14 and a side surface of each of a channel regions 4 form a substantially perpendicular junction surface, a gate length $L_g$ is set to be not more than the depth $X_{ch}$ of the channel regions 4. Additionally, in order to equalize the depth of the channel regions 4 and the depth of the n type impurity region 14, dose amounts of respective impurities are at levels comparable to each other.

In the second embodiment, a ratio of a separation width $L_{KT}$ of a gate electrode 13 to the depth $X_{ch}$ of the channel region 4 ($L_{KT}:X_{ch}$) is set to 0.15 or less:1. To be more concrete, the separation width $L_{KT}$ is set to 0.6 μm, and the depth $X_{ch}$ of the channel regions 4 is set to 4 μm. Furthermore, a resistivity of an n⁻ type epitaxial layer 2 is set to a range of 15 Ω·cm to 20 Ω·cm.

By adopting the above-described conditions for the separation width $L_{KT}$ and the depth $X_{ch}$ of the channel region 4, the depletion layer 50 is fully pinched off, and a pn junction having a substantially perpendicular junction surface is obtained. Therefore, it is possible to increase an impurity concentration of the n type impurity region 14 to $1\times10^{17}$ cm$^{-3}$. Note that an impurity concentration of the channel region 4 is also $1\times10^{17}$ cm$^{-3}$ in this case.

Specifically, in the ON state of the MOSFET, since the impurity concentration of the n type impurity region 14 which is a region (the conventional π portion) serving as a current path just below the gate electrode 13, is high, it is possible to allow a current through the current path with a low resistance, and hence an on-resistance of the MOSFET can be reduced. On the other hand, in the OFF state of the MOSFET, the depletion layer 50 can be widened uniformly in the depth direction of the substrate (vertically). Therefore, even in the case where a voltage of about 600 V is applied between the source and the drain, it is possible to widen the depletion layer 50 uniformly in the depth direction of (vertical direction to) the substrate. Specifically, the MOSFET having a low on-resistance as well as a high breakdown voltage of about 600 V can be provided.

Figure 2:
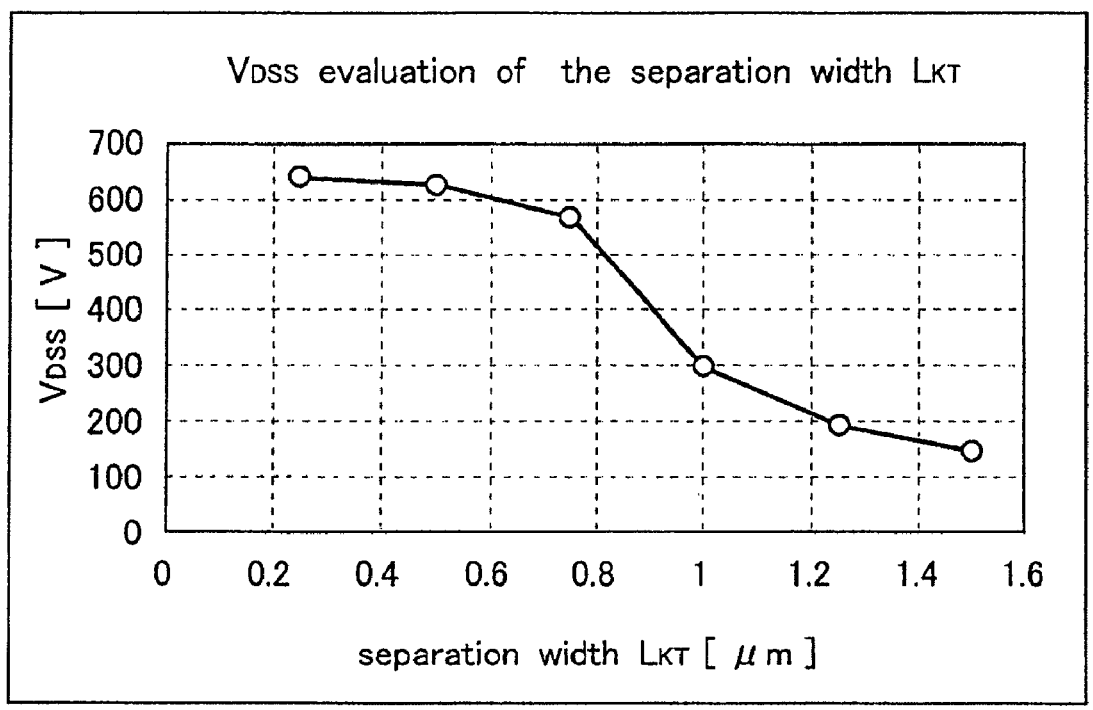
FIG. 2 is a characteristic chart explaining the semiconductor device of the first and the second embodiments of the invention.
Figure 3:
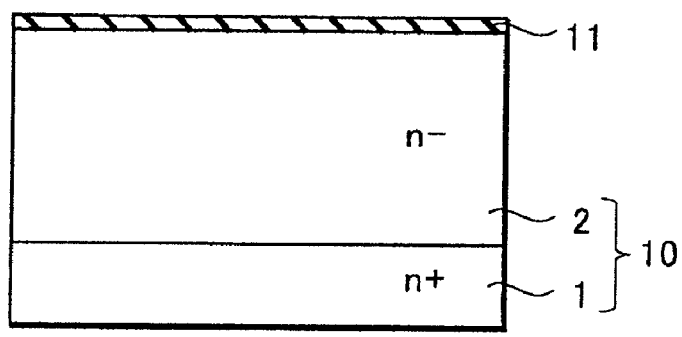
FIG. 3 is a cross-sectional view explaining a method of manufacturing the semiconductor device of the first and the second embodiments of the invention.
Figure 4:
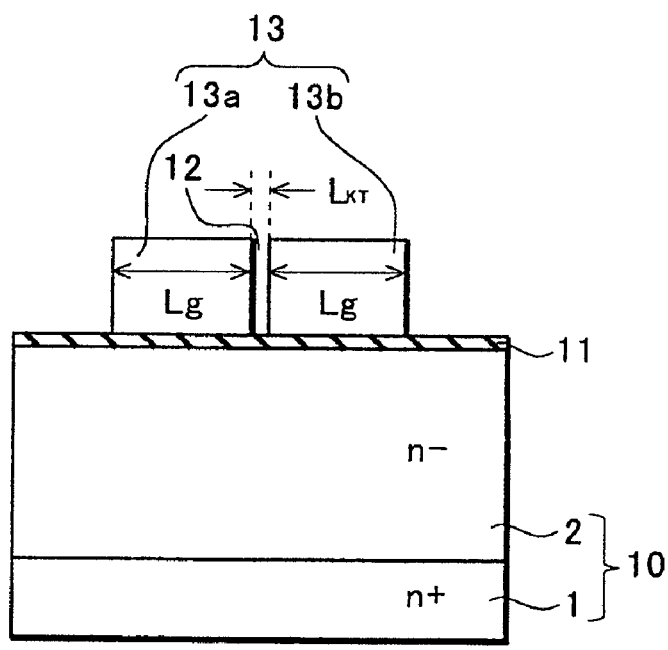
FIG. 4 is a cross-sectional view explaining the method of manufacturing the semiconductor device of the first and the second embodiments of the invention.

FIG. 2 is a chart showing a relation between the separation width $L_{KT}$ and $V_{DSS}$. Under the condition that the n type impurity region 14 is formed with a constant impurity concentration, the breakdown voltage ($V_{DSS}$) was evaluated while the separation width $L_{KT}$ being varied. Note that a dose amount of the n type impurity region 14 is $1.5\times10^{13}$ cm$^{-2}$.

According to the above-described structure, if the separation width $L_{KT}$ is 0.6 μm or less, the depletion layer 50 is fully pinched off. Therefore, it is proved that the n type impurity region 14 with the breakdown voltage of 600 V is obtained.

By referring to FIG. 3 to FIG. 9, a method of manufacturing the MOSFET of these embodiments will be described by taking a case of the second embodiment as an example.

A method of manufacturing the semiconductor device of this embodiment comprises: a step of forming a drain region by laminating a one conductivity type semiconductor layer on a one conductivity semiconductor substrate and of forming a first insulating film on the entire surface of the resultant structure; a step of forming a plurality of gate electrodes on the first insulating film, at least part of which are isolated from each other with a predetermined separation width; a step of implanting impurities of one conductivity type into a surface of the semiconductor layer between the plurality of gate electrodes; implanting impurities of an opposite conductivity type to one conductivity type into a surface of the semiconductor layer outside the plurality of gate electrodes; a step of performing a thermal treatment, thus forming a plurality of channel regions and an impurity region of one conductivity type having a junction surface approximately perpendicular to a side surface of each of the channel regions; a step of forming a source region of one conductivity type in surfaces of the channel regions; and a step of forming a second insulating film covering the plurality of gate electrodes wholly.

A First Step (See FIG. 3):

An n$^-$ type epitaxial layer 2 is laminated on an n$^+$ type silicon semiconductor substrate 1, thus preparing a substrate serving as a drain region 10. An entire surface of the resultant structure is thermally oxidized at a temperature of about 1000° C., thus forming a gate oxide film 11 to a thickness of, for example, about 1000 Å in accordance with a threshold value of the MOSFET.

A Second Step (See FIG. 4):

A non-doped polysilicon layer is deposited on an entire surface of the gate oxide film 11, and phosphor (P), for example, is implanted and diffused into the non-doped polysilicon layer at a high concentration, thus making the non-doped polysilicon layer highly conductive. By use of a photoresist film (not shown) having a desired pattern as a mask, the polysilicon film is subjected to dry etching, thus forming a gate electrode 13. One cell of the MOSFET is composed of gate electrodes 13a and 13b, which have an equal gate width $L_g$ and which are separated from each other at last part of thereof by a separation hole 12. Specifically, the separation hole 12 is formed simultaneously with a formation of a pattern of the gate electrode 13, thus forming the separated gate electrodes 13a and 13b. A width of the separation hole 12, which is a separation width $L_{KT}$, is equal to about 0.6 μm, for example. Note that the gate electrode 13 may be formed in a way that an impurity doped polysilicon layer is deposited on the entire surface of an insulating film 11 and then patterned. The patterning of the gate electrode 13 and the formation of the separation hole 12 may be carried out in different steps. Since the separated gate electrodes 13a and 13b, which are separated from each other, have the same structure, the description of subsequent steps will be made by use of the separated gate electrode 13a.

The gate width $L_g$ of the separated gate electrode 13a is set to be not more than a depth of a channel region to be formed afterward, which is, for example, about 2.0 μm.

Figure 5:
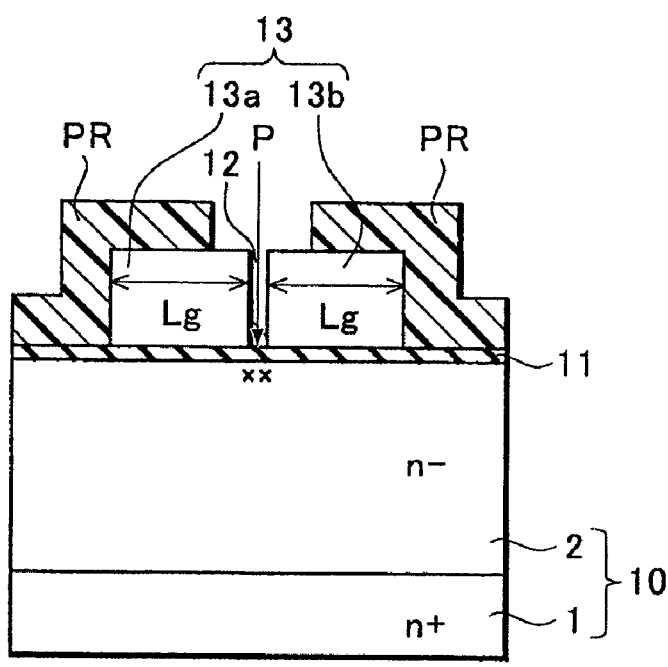
FIG. 5 is a cross-sectional view explaining the method of manufacturing the semiconductor device of the first and the second embodiments of the invention.
Figure 6:
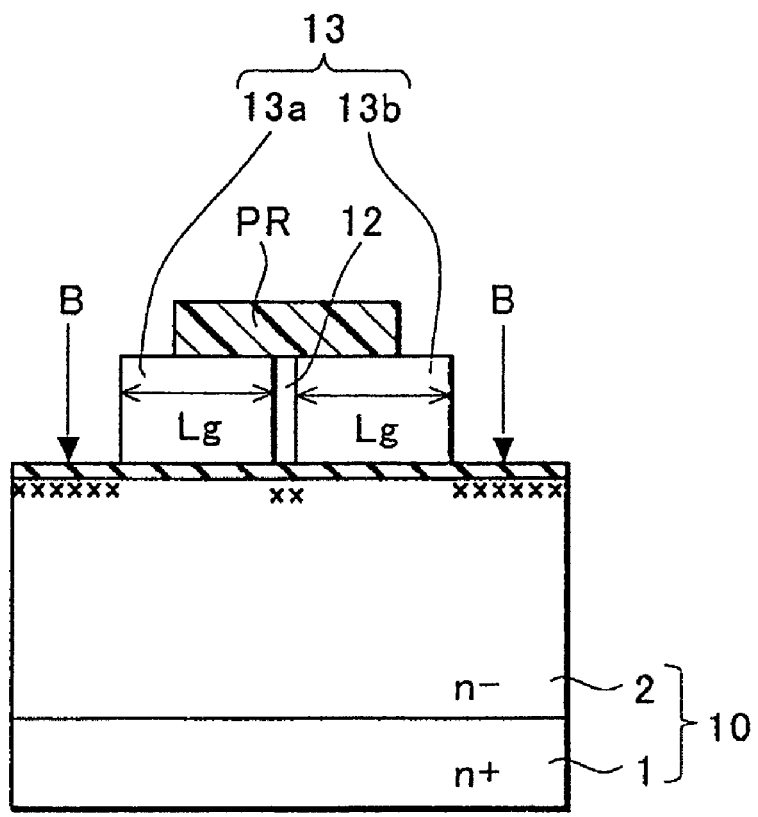
FIG. 6 is a cross-sectional view explaining the method of manufacturing the semiconductor device of the first and the second embodiments of the invention.
Figure 7:
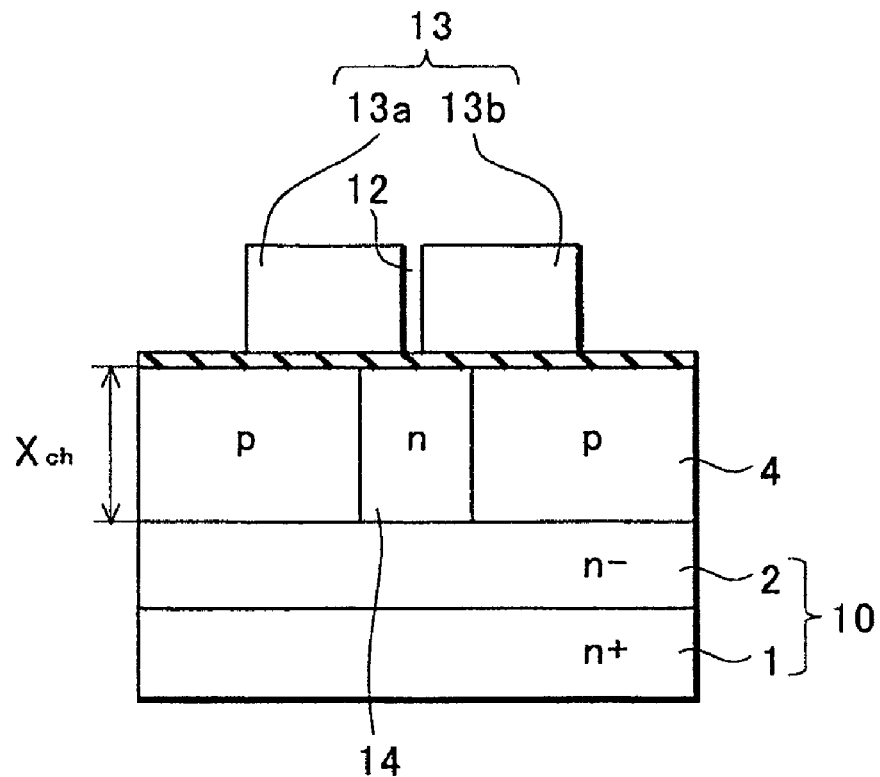
FIG. 7 is a cross-sectional view explaining the method of manufacturing the semiconductor device of the first and the second embodiments of the invention.
Figure 8A:
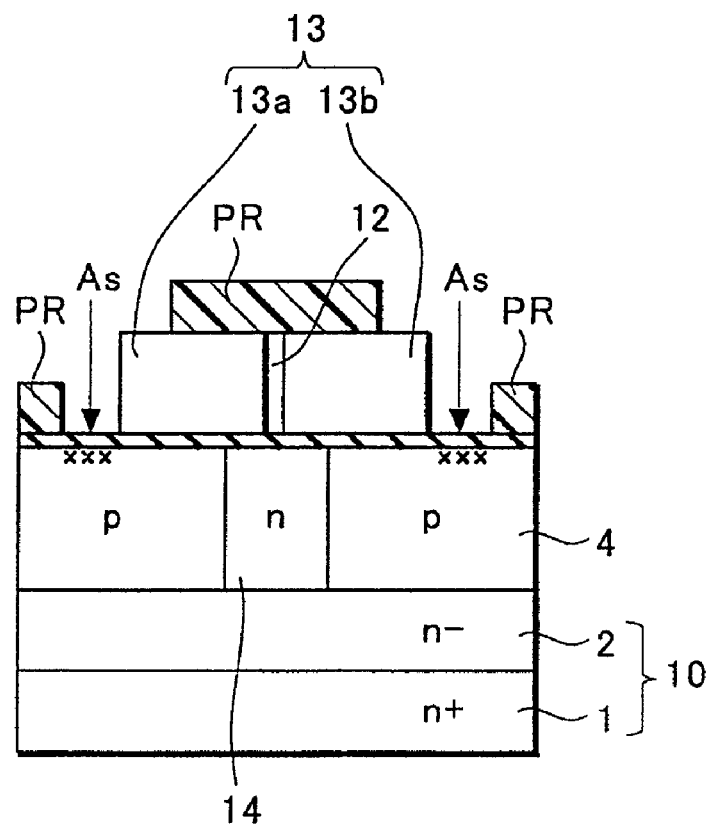
FIGS. 8A and 8B are cross-sectional views explaining the method of manufacturing the semiconductor device of the first and the second embodiments of the invention.
Figure 8B:
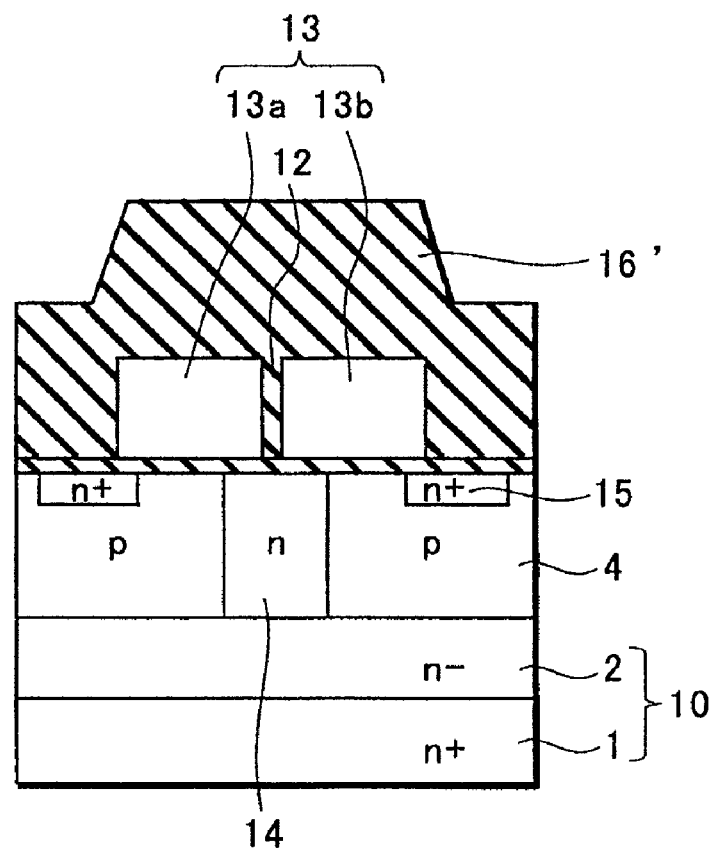
Figure 9:
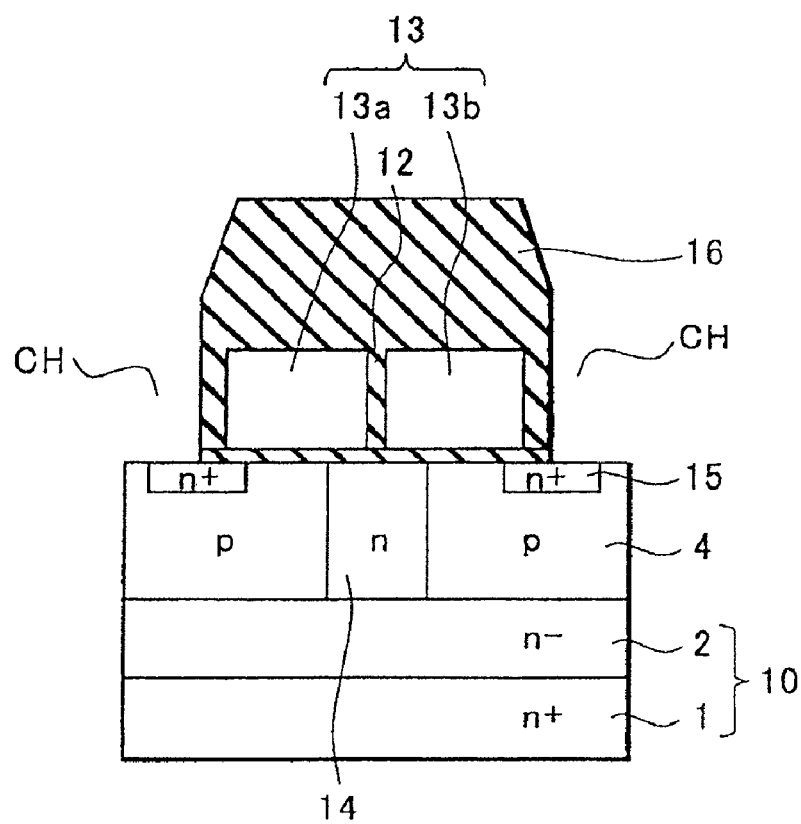
FIG. 9 is a cross-sectional view explaining the method of manufacturing the semiconductor device of the first and the second embodiments of the invention.

A Third Step (See FIG. 5):

A photoresist film PR is formed on an entire surface of the resultant structure, and then patterned so that the separation hole 12 and a periphery of the separation hole 12 are exposed. N type impurities, for example, phosphor P, are ion-implanted by use of the photoresist film PR as a mask. For example, a dose amount is about $1.0\times10^{13}$ cm$^{-2}$, and an acceleration energy is 120 KeV. The n type impurities are implanted from the separation hole 12 into the surface of an n$^-$ type epitaxial layer 2 through the gate oxidized film 11. Specifically, a surface region of the n$^-$ type epitaxial layer 2 having a width approximately equal to the separation width $L_{KT}$, which is located just below the separation hole 12, is an implantation region of the n type impurities, as shown in FIG. 5.

A Fourth Step (See FIG. 6):

A photoresist film PR is formed again, and a portion in the photoresist film PR covering at least the separation hole 12 is left by use of a photolithography process. P type impurities, for example, boron (B), are ion-implanted into the surface of the n$^-$ type epitaxial layer 2 outside the gate electrode 13. Herein, a dose amount of the p type impurities in the fourth step and the dose amount of the n type impurities in the third step are approximately equal. For example, in the case of the boron, the boron impurities are ion-implanted under the condition that the acceleration energy is 80 KeV and the dose amount is $2\times10^{13}$ cm$^{-2}$. The surface of the n$^-$ type epitaxial layer 2 outside both sides of the gate electrode 13 is an implantation region into which the p type impurities are implanted.

A Fifth Step (See FIG. 7):

A thermal treatment is carried out at a temperature of 1150° C. for 180 minutes, whereby the n type impurities and the p type impurities are diffused. Thus, channel regions 4 are formed in portions of a surface of the epitaxial layer 2 disposed on both sides of the gate electrode 13, and an n type impurity region 14 is formed below the separation hole 12.

The n type impurities implanted from the separation hole 12 are diffused in a vertical direction with respect to the depth of the substrate, and simultaneously are diffused in a lateral (horizontal) direction with respect to the substrate. Specifically, by setting the gate length $L_g$ of the separated gate electrode 13a to be equal to or less than the depth $X_{ch}$ of the channel region 4, side surfaces of the n type impurity region 14 form junction surfaces substantially parallel to the side surfaces of the channel regions 4 adjacent thereto. Additionally, a bottom of the n type impurity region 14 and bottoms of the channel regions 4 are located at depths substantially equal to each other by the diffusion of the impurities under the conditions of the fourth step.

Furthermore, a relation expressed by a ratio (the separation width $L_{KT}$:the depth $X_{ch}$ of the channel region 4, which is equal to 0.15 or less:1) is adopted. To be more concrete, $L_{KT}$ is set to 0.6 μm, and $X_{ch}$ is set to 4 μm. Thus, a depletion layer can be fully pinched off in the n type impurity region 14.

Specifically, since it is possible to suppress a breakdown in the vicinity of the bottoms of the channel regions 4, the impurity concentration of the n type impurity region 14 can be improved to be higher than that in the related arts. Accordingly, it is possible to reduce a resistance of a current path in the ON state of the MOSFET.

When the depth $X_{ch}$ of the channel region 4 is formed to be further deeper depending on characteristics of the MOSFET, the diffusion process is further carried out. Thus, though the width of the n type impurity region 14 varies, there is no problem as long as the width thereof is within a range where the MOSFET can pinch off at the application of $V_{DSS}$.

A Sixth Step (See FIGS. 8a and 8b):

A mask exposing a part of the channel region 4 is formed by a new photoresist film PR, $n^+$ type impurities, for example, arsenic (As), are ion-implanted. An acceleration energy is set to 100 KeV, and a dose amount is set to about $5 \times 10^{15}$ cm$^{-2}$ (see FIG. 8A).

Thereafter, an insulating film 16' such as PSG (Phosphorus Silicate Glass) serving as an interlayer insulating film is deposited by a CVD method. The $n^+$ type impurities are diffused by a thermal treatment at the time when the insulating film 16' is formed, thus forming a source region 15 (see FIG. 8A). The thermal treatment is carried out at a temperature lower than 1000° C. for about 60 minutes.

A Sixth Step (FIG. 9):

The insulating film 16' is etched by use of a new photoresist film (not shown) as a mask, and an interlayer insulating film 16 is left, and simultaneously contact holes CH are formed. The separated gate electrodes 13a and 13b above the n type impurity region 14 are wholly covered with the interlayer insulating film 16.

Thereafter, a barrier metal (not shown) is formed on the entire surface of the resultant structure, and aluminum alloy is sputtered so as to have a film thickness ranging from about 20000 Å to 50000 Å. An alloying and thermal treatment is performed, thus forming a source electrode 18 patterned to a desired pattern. Thus, a final structure shown in FIG. 1A is obtained.

An n channel type MOSFET was described as the example in this embodiment of the present invention, and a p channel type MOSFET having an opposite conductive type to the n channel type MOSFET can be similarly embodied. Preferred embodiments of the present invention are not limited to these. Specifically, preferred embodiments of the present invention can be similarly embodied and the same effects can be achieved as long as the semiconductor element is one of insulated gate type including an IGBT (Insulated Gate Bipolar Transistor) which is an insulated gate type bipolar transistor and in which a semiconductor layer having an opposite conductivity type to the one conductivity type semiconductor substrate 1 is disposed below the substrate 1.

According to preferred embodiments of the present invention, first, the n type impurity region is provided, whereby the junction surface in which the side surface of the channel region is substantially perpendicular to the side surface of the n type impurity region can be formed. Accordingly, a width of an interval between the channel regions is constant from the surface of the channel regions to the bottom thereof. Then, by forming the n type impurity region under the condition that the depletion layer extending from both sides of the channel regions is pinched off (with a certain impurity concentration and a certain width), the pinch-off of the depletion layer is sufficient even in the bottom portion of the channel region. Thus, it is possible to avoid a breakdown in corner portions of the channel regions (regions "a" of FIG. 10).

To be more concrete, in the diffusion step of forming the channel region, by setting the depth $X_{ch}$ of the channel region to be not less than the gate length $L_g$ of the separated gate electrodes of one cell, it is possible to provide the n type impurity region having the junction surface perpendicular to the side surface of the channel region and having the depth equal to that of the channel region.

Furthermore, by adopting a relation expressed by a ratio (the separation width $L_{KT}$ of the separated gate electrodes:the depth $X_{ch}$ of the channel region, which is equal to or less than 0.6:4), it is possible to form the n type impurity region forming the junction surface perpendicular to the channel region, and it is possible to make the width of the n type impurity region equal to the width having a value for pinching off the depletion layer in the n type impurity region. Thus, the drain-to-source voltage $V_{DSS}$ of not less than 600 V can be obtained. Furthermore, since the depletion layer is fully pinched off even in the vicinity of the bottom portion of the channel region, it is possible to increase the impurity concentration of the n type impurity region up to $1 \times 10^{17}$ cm$^{-3}$. Hence, it is possible to achieve a low resistance in the ON state of the MOSFET and an increase of the breakdown voltage in the OFF state thereof.

Secondly, performing the ion-implantation of n type impurity region, after the formation of the gate electrode, the n type impurity region is formed in the diffusion step for forming the channel region. Thus, a control of the depth of the n type impurity region is made easier without being influenced by the thermal treatment during the formation of the gate electrode.

Furthermore, by controlling of the dose amount in the channel region and the n type impurity region, it is possible to form the bottoms thereof to be substantially uniform. For example, boron is implanted into the channel region under the condition that the acceleration energy is 80 KeV and the dose amount is $2 \times 10^{13}$ cm$^{-2}$, and phosphor is implanted into the n type impurity region under condition that the acceleration energy is 120 KeV and the dose amount is $1 \times 10^{13}$ cm$^{-2}$, and then the thermal treatment is carried out at the temperature of 1150° C. Thus, the channel region and the n type impurity region have the substantially uniform depth. In this case, though the n type impurity region has an impurity concentration, which is about $1 \times 10^{17}$ cm$^{-3}$ and is higher than that in the related art, the depletion layer is pinched off vertically in the depth direction of the substrate. Thus, the predetermined breakdown voltage is obtained. For example, in this embodiment, in the case where the resistivity p of the n type epitaxial layer ranges from 15 Ω·cm to 20 Ω·cm, the drain-to-source breakdown voltage of not less than 600 V can be obtained.

What is claimed is:

1. A method of manufacturing a semiconductor device, comprising:

providing a device intermediate comprising a semiconductor substrate of a first general conductivity type, a semiconductor layer of the first general conductivity type disposed on a surface of the semiconductor substrate and a first insulating film disposed on the semiconductor layer;

forming on the first insulating film a gate electrode having an opening therein;

implanting a first impurity for the first general conductivity type into part of the semiconductor layer through the opening of the gate electrode;

implanting a second impurity for a second general conductivity type into part of the semiconductor layer that is outside the gate electrode using the gate electrode as a mask;

heating the device intermediate so that the first and second impurities are diffused so as to form an impurity region and a channel region that have an junction interface perpendicular to the surface of the semiconductor substrate;

wherein during the heating of the device intermediate the impurity region of the first impurity and the channel region of the second impurity are formed simultaneously;

forming a source region of the first general conductivity type in the channel region; and forming a second insulating film covering the gate electrode.

2. The method of claim 1, wherein a width of the gate electrode between the opening and an edge of the gate electrode is equal to or less than a depth of the channel region.

3. The method of claim 1, wherein the impurity region and the channel region have an equal impurity concentration.

4. The method of claim 3, wherein the equal impurity concentration is about $1 \times 10^{17}$ cm$^{-3}$.

5. The method of claim 1, wherein the opening of the gate electrodes creates a separation of two parallel portions of the gate electrode, a ratio of a separation width between the two parallel portions to a depth of the channel region is 0.15 or smaller.

6. The method of claim 1, wherein a bottom of the impurity region and a bottom of each of the channel region are at a same level.

7. The method of claim 1, wherein the source region is formed by an ion implantation and a diffusion.

8. The method of claim 1, wherein during the implanting of the second impurity the opening of the gate electrode is covered by a mask.

* * * * *